(12) United States Patent
Lu et al.

(10) Patent No.: US 8,636,559 B2
(45) Date of Patent: Jan. 28, 2014

(54) METHOD FOR WAFER BACK-GRINDING CONTROL

(75) Inventors: Chen-Fa Lu, Gangshan Township (TW); Chiang-Hao Lee, Changhua (TW); Wei-Yu Chen, Taipei (TW); Chung-Shi Liu, Shin-Chu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/618,836

(22) Filed: Sep. 14, 2012

(65) Prior Publication Data

US 2013/0011937 A1  Jan. 10, 2013

Related U.S. Application Data

(62) Division of application No. 12/900,683, filed on Oct. 8, 2010, now Pat. No. 8,298,041.

(51) Int. Cl.
*B24B 49/00* (2012.01)
*B24B 51/00* (2006.01)

(52) U.S. Cl.
USPC ........... 451/5; 451/9; 451/10; 451/11; 451/41

(58) Field of Classification Search
USPC ............. 279/3, 4.02, 126; 451/5, 8, 9, 10, 11, 451/41, 57, 58, 63, 285, 286, 287, 288, 289, 451/290, 397, 398
See application file for complete search history.

(56) References Cited

U.S. PATENT DOCUMENTS

| 5,240,552 | A  | * | 8/1993  | Yu et al. .............................. 438/5 |
| 6,198,294 | B1 |   | 3/2001  | Black |
| 6,488,569 | B1 | * | 12/2002 | Wang et al. ......................... 451/8 |
| 6,572,444 | B1 | * | 6/2003  | Ball et al. ......................... 451/10 |
| 7,357,695 | B2 | * | 4/2008  | Elledge ............................ 451/11 |
| 2002/0052052 | A1 | * | 5/2002 | Robinson et al. .................. 438/5 |
| 2009/0008794 | A1 |   | 1/2009 | Wu et al. |
| 2009/0042488 | A1 | * | 2/2009 | Sekiya et al. ..................... 451/41 |
| 2011/0091676 | A1 | * | 4/2011 | Kim et al. ..................... 428/41.8 |
| 2012/0208012 | A1 | * | 8/2012 | Watanabe et al. ............. 428/354 |

FOREIGN PATENT DOCUMENTS

| CN | 1279506 A | 1/2001 |
| TW | 200626292 | 8/2006 |

OTHER PUBLICATIONS

Office Action dated Jul. 16, 2013 from corresponding application No. TW 100106850.

Chinese Office Action dated Nov. 13, 2013 for application No. 201110070909.0.

\* cited by examiner

*Primary Examiner* — Timothy V Eley
(74) *Attorney, Agent, or Firm* — Lowe Hauptman & Ham, LLP

(57) ABSTRACT

A method of reducing manufacturing defects of semiconductor wafers during a back-grinding process. The method includes receiving a semiconductor wafer on a chuck table, wherein said chuck table has a surface upon which a front side of the wafer is placed, and wherein said chuck table has one or more holes in surface and one or more sensors placed in said one or more holes. The method further includes grinding at least a portion of a back side of the semiconductor wafer. The method further includes monitoring a parameter, while grinding, measured by the one or more sensors and adjusting the grinding based at least on the monitored parameter.

20 Claims, 6 Drawing Sheets

METHOD FOR WAFER BACK-GRINDING CONTROL

RELATED APPLICATIONS

The present application is a Divisional application of U.S. application Ser. No. 12/900,683, filed Oct. 8, 2010, the disclosure of which is hereby incorporated by reference herein in its entirety.

BACKGROUND

The continued scaling of semiconductor devices to ever smaller dimensions creates a number of manufacturing challenges. One process related to this trend involves the production of very thin semiconductor wafers used in integrated circuit (IC) fabrication. Some current approaches in the industry known to the inventors use "back-grinding" of semiconductor wafers to reduce their thickness. This practice involves the completion of the front (or "active") side of a semiconductor wafer, followed by removal of excess substrate from the back side of the wafer.

During the back-grinding process, the wafer is placed on a chuck table and a grinding wheel grinds off the excess substrate. There are some systems that grind a wafer in an in-line fashion or sequential/serial, while others grind several wafers concurrently with several respective grinding wheels. Approaches known to the inventors for controlling the back-grinding process typically have involved measurement of related parameters, e.g., measuring the current used to drive the grinding wheel in combination with measuring the revolutions of the grinding wheel spindle. Such parameters reflect the friction between the wheel and wafer and are controlled to be within respective acceptable ranges. Other solutions have used a measured capacitance between the wafer and a capacitive plate above the wafer.

BRIEF DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
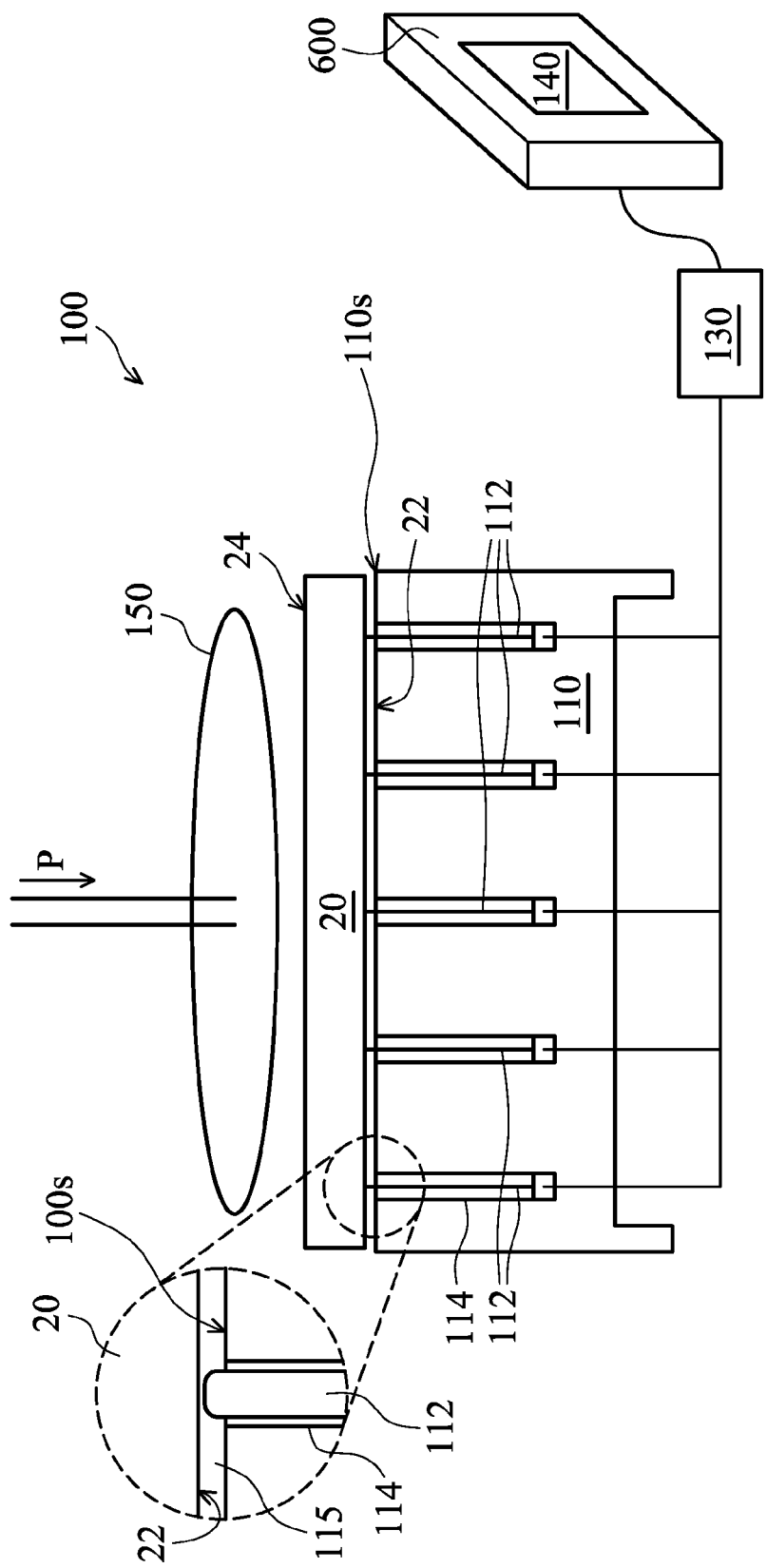
FIG. 1 is a high-level diagram of a control system in an in-line wafer back-grinding process flow according to one or more embodiments of the disclosure.

The below descriptions describe embodiments of systems and methods for reducing manufacturing defects (such as wafer breakage, warpage, etc.) and/or promoting uniform thickness of a semiconductor wafer during back-grinding processes. The use of "an embodiment" or "one embodiment" is not intended to convey that the descriptions pertain to a single embodiment, but that the features described are present in at least one implementation. Like features will generally be referred to with like reference numerals, but this is also not intended to denote a requirement that the same features appear in each embodiment. Also, features depicted in the figures are not drawn to scale and therefore should not be construed to place particular size limitations on the systems described.

Throughout the following descriptions and in the attached figures, at least one semiconductor wafer 20 (FIG. 1) is back-ground to remove excess substrate. An apparatus (not shown or numbered) places back-grinding (BG) tape (not shown) on a front side 22 of wafer 20 prior to placing the wafer on a back-grinding apparatus. Taping front side 22 protects the active circuitry on wafer 20. The back-grinding apparatus then removes excess substrate from a back side 24 of wafer 20 during a back-grinding process. During an in-line back-grinding process, a single wafer 20 is processed in conveyor-like fashion as a part of a series of steps. Subsequent to back-grinding, wafer 20 is moved to one or more other machines for polishing, tape removal, and other processing steps related to the prior or subsequent steps. During a multiple-concurrent back-grinding process, two or more wafers 20 are back-ground simultaneously, or at substantially the same time, by a back-grinding apparatus.

FIG. 1 is a high-level diagram of a control system 100 in an in-line wafer back-grinding process flow according to one or more embodiments of the disclosure. In system 100, which is a real-time control system in some embodiments, a single semiconductor wafer 20 is back-ground on a chuck table 110. In various embodiments, semiconductor wafer 20 is held on chuck table 110 through suction, a physical clipping mechanism, or other suitable means for preventing movement of the wafer which are not shown for simplicity and clarity of the drawings.

A grinding wheel 150 applies pressure, noted with bold force vector arrow P, vertically to back side 24 of semiconductor wafer 20 during a back-grinding process that removes excess substrate. In some embodiments, the chuck table 110 and grinding wheel 150 spin simultaneously in the same direction (i.e., both in a clockwise or counterclockwise direction). In other embodiments, chuck table 110 spins opposite to grinding wheel 150 (e.g., one spins clockwise and the other spins counterclockwise)

At least one hole 114 is defined in an upper surface 110*s* of chuck table 110. In some embodiments, chuck table 110 includes several holes 114 perpendicular to upper surface 110*s*, i.e., also with respect to front side 22 of the wafer during the back-grinding process. One or more sensors 112 are then placed in the respective one or more holes 114. In some embodiments, sensors 112 are BARATRON® pressure transducers as produced by MKS Instruments of Andover, Mass. Other sensors are used in further embodiments as will be apparent to one of ordinary skill in the art. In some embodiments, holes 114 are not perpendicular to upper surface 110*s*. However, in embodiments where holes 114 are perpendicular to upper surface 110*s*, the perpendicular nature of the holes and sensor placement therein removes or minimizes the horizontal component of the pressure measurement and thus, simplifies the measurement and/or subsequent processing.

Semiconductor wafer 20 applies pressure to sensors 112 and/or transfers pressure applied by grinding wheel 150 to the sensors through direct contact. In some embodiments, sensors 112 protrude slightly above upper surface 110s of chuck table 110 in order to contact semiconductor wafer 20 (or the BG tape if used) directly. This is exemplarily illustrated in the enlarged view section of FIG. 1 which shows that sensor 112 protrudes beyond upper surface 110s of chuck table 110 to contact front side 22 (or the BG tape applied thereon) of wafer 20. The protrusion of sensor 112 defines a space 115 between upper surface 110s of chuck table 110 and front side 22 of wafer 20.

Semiconductor wafer 20 placed on chuck table 110 exerts an initial pressure corresponding to the mass of the wafer distributed on sensors 112. Descriptions of measurements above and below of pressure P are thereby directed to the difference between the initial pressure on sensors 112 and the initial pressure combined with pressure applied by back-grinding wheel 150. Stated another way, the initial pressure that is present throughout the back-grinding process is factored out of the measurement of pressure P, so that only the pressure applied by back-grinding wheel 150 is monitored and controlled.

Sensors 112 are connected to a control box 130 that translates signals received from sensors 112 into a form usable by a computer process control tool 140. For example, in some embodiments, control box 130 converts signals received from pressure sensors 112 from a voltage reading into a digital signal to provide a digital representation of pressure P. In other embodiments, pressure transducers provide a current, rather than a voltage, to control box 130 based on the measured pressure P.

In some embodiments, sensors 112 are pressure transducers measuring pressure within one newton of precision. In at least some embodiments, control box 130 is configured to convert readings between 10 newtons and 100 newtons into a digital representation. The configuration exceeds ranges of measurements that are above and below the upper and lower limits of acceptable back-grinding pressures, such as a range between about 25 newtons and about 75 newtons. In other embodiments, sensors 112 have different levels of precision or different ranges over which pressure measurements are taken. In some embodiments, control box 130 is integrated with one or more of sensors 112. In further embodiments, control box 130 is integrated with a computing system (e.g., 600 in FIG. 6) executing a computer process control tool 140, described below.

Computer process control tool 140 is a set of instructions for execution of a computer-implemented statistical process control (SPC). A computing system 600 (shown in and described with respect to FIG. 6) executes the SPC, which is configured to monitor and control each step of a fabrication process. Some processes controlled by the SPC have parameters that are statistically based, e.g., an average value over time is used to determine if the fabrication process is within an acceptable range of values. Other fabrication processes, such as the back-grinding process, operate on a threshold value or range of values.

Computer process control tool 140 receives data (e.g., pressure value readings) from control box 130 and/or other tools and machines within a semiconductor fabrication facility. The SPC puts the measurements (e.g., pressure value readings) in series of values, e.g., a trend chart, and monitors parameters during the fabrication process in an organized and inter-related manner. Thus, if any of the measured process parameters are not within specified limits, the monitored fabrication process is paused. For example, if the data received from control box 130 denotes a pressure reading that is too high or too low, adjustment is made to the pressure P applied by grinding wheel 150, e.g., by raising or lowering grinding wheel 150. By halting the back-grinding process when the pressure applied is too high, some breakage or warpage of wafers is avoided or at least minimized. Likewise, if the pressure applied is kept within a range of specified acceptable readings (especially when grinding wheel 150 spins clockwise or counterclockwise along back side 24 of wafer 20 during the back-grinding process), then greater uniformity in the thickness of the wafer is achieved. Uniformly applying pressure P to the wafer relates to the total thickness variation (TTV) across a wafer. Greater uniformity in pressure application during back-grinding reduces TTV across a wafer.

Figure 2:
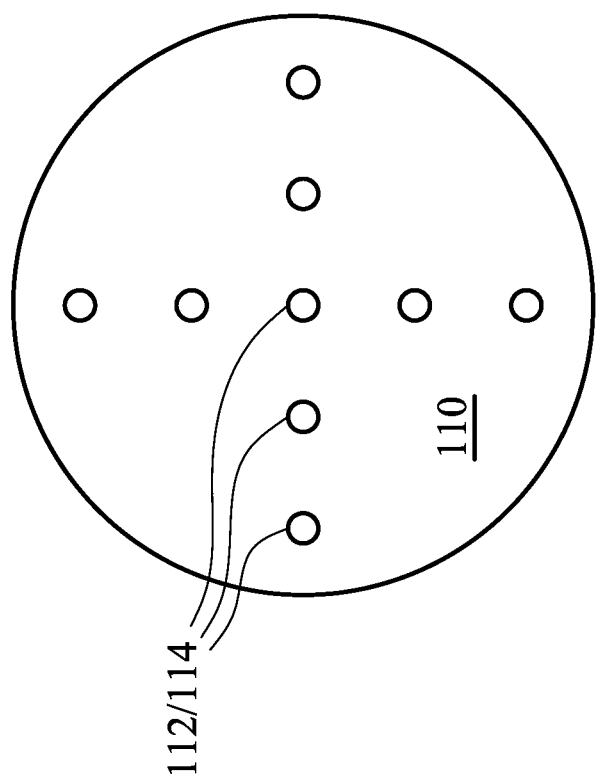
FIG. 2 is a top view of a chuck table in accordance with one or more embodiments.

FIG. 2 is a top view of chuck table 110 in system 100, showing an exemplary placement of holes 114 (and hence sensors 112). Nine sensors 112 are shown in this view, corresponding to sensor placement in the center, along the edge and at midpoints between the center and the edge. This exemplary configuration shows that the sensors 112 are located at different points on the chuck table 110 so as to provide redundancy and accuracy in the measurements. A legitimate but abnormally high pressure measurement at one sensor is likely to show as an elevated pressure measurement at an adjacent sensor. Therefore, extremely high pressure readings at one sensor without some elevated reading at another adjacent sensor are likely to be due to sensor error rather than an actual increase of applied pressure. As previously noted, alternative embodiments employ greater or fewer number of sensors. In some embodiments, a single pressure sensor is employed.

In some embodiments computer numerical control (CNC) lathes (not shown) are used to bore holes 114 in chuck table 110. In the exemplary embodiment shown in FIGS. 1-2, holes 114 are bored at the center, edge and midpoints of chuck table 110. In some embodiments, holes 114 are bored only in the approximate center of the table. In other embodiments, holes 114 are bored near the edge of the table. In alternate embodiments, different hole placements are constructed as will be apparent to one of ordinary skill in the art in light of the present disclosure. In other embodiments, holes 114 need not be bored into chuck table 110, e.g., chuck table 110 is formed with one or more holes 114 defined within the table at the time of manufacture. Other methods for constructing chuck table 110 with holes 114 for sensor placement will be apparent to one of ordinary skill in the art while also contemplated within the context of the present disclosure.

Figure 3:
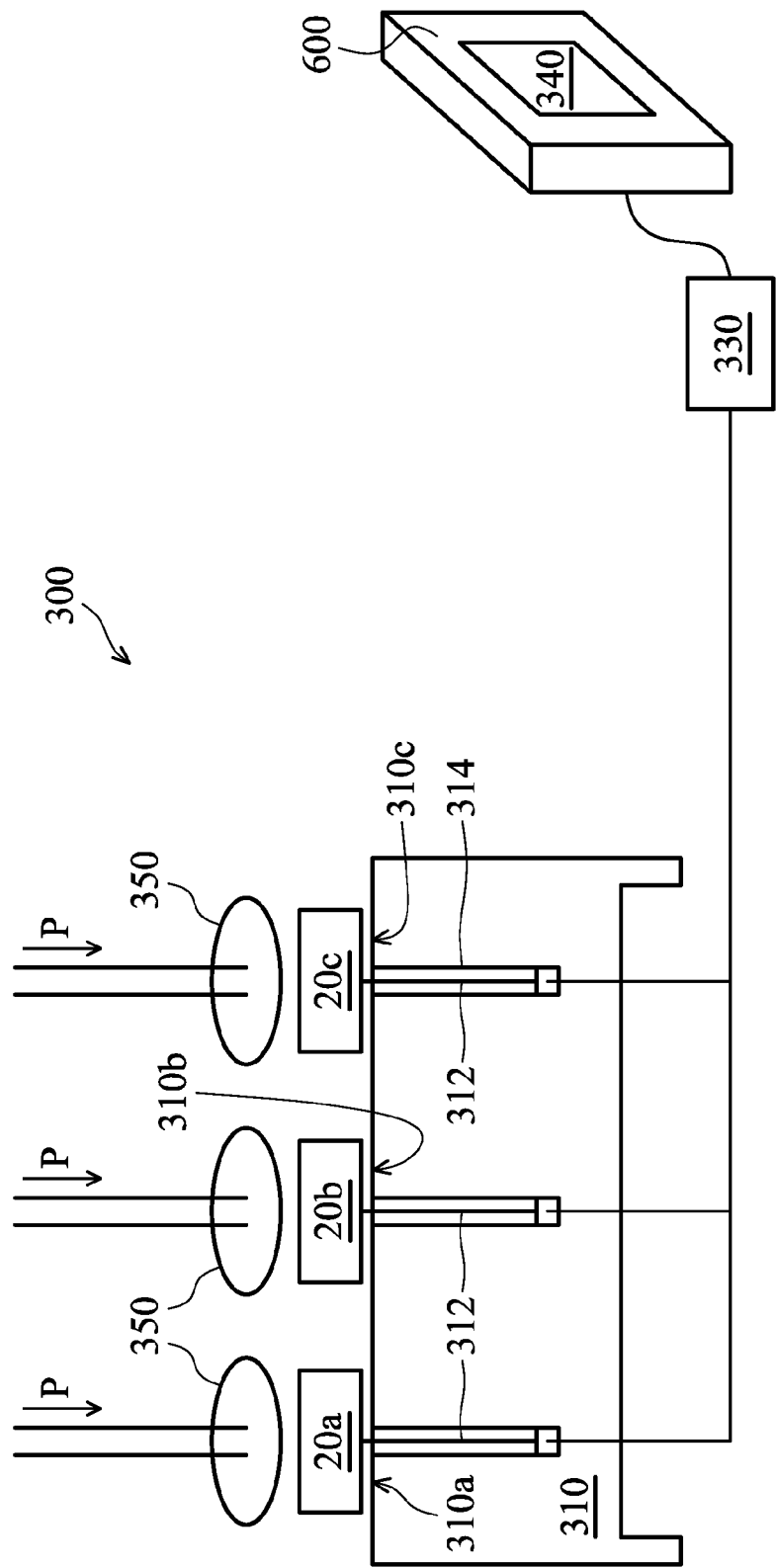
FIG. 3 is a high-level diagram of a control system in a multiple-concurrent wafer back-grinding process flow according to one or more embodiments of the disclosure.

FIG. 3 is a simplified diagram of a control system 300 in a multiple-concurrent wafer back-grinding process flow according to one or more embodiments. In some embodiments, control system 300 is configured for real-time monitoring and control of such a multiple-concurrent wafer back-grinding process. System 300 has many similar features to system 100 (FIG. 1), including sensors 312, a control box 330 and a process tool 340 which are similar to sensors 112, control box 130 and process tool 140, respectively. However, in system 300, there are multiple surfaces (or surface regions) 310a, 310b, and 310c for placement of multiple wafers 20a, 20b, and 20c on a chuck table 310. System 300 also includes multiple grinding wheels 350.

The plurality of placement surfaces (or surface regions) 310a, 310b, and 310c on chuck table 310 are each equipped with one or more corresponding sensors 312 disposed therein. Sensors 312 are pressure transducers capable of converting a pressure measurement into a corresponding voltage or current. The exemplary configuration in FIG. 3 includes a single respective sensor 312 below each surface 310a/310b/310c. In further embodiments, multiple sensors are used for the reasons enumerated above and would provide additional features and benefits. Holes 314 (similar to holes 114 in FIG. 1) for holding sensors 312 are bored in chuck table 310 using CNC lathes or chuck table 310 is constructed with holes preformed for placement of sensors 312, as previously described.

Figure 4:
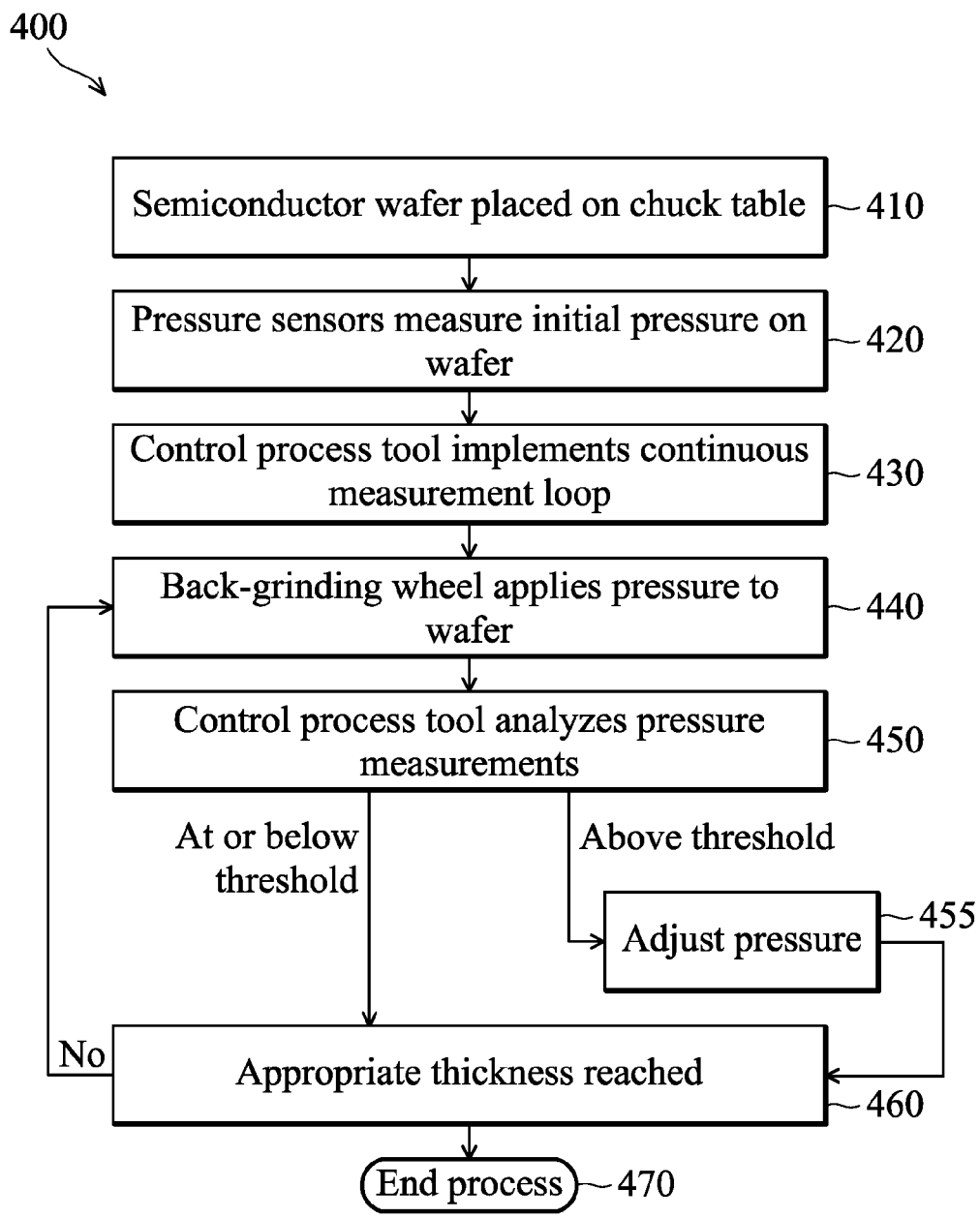
FIG. 4 is a flowchart representing a method of reducing manufacturing defects of semiconductor wafers during a back-grinding process in accordance with one or more embodiments.

FIG. 4 is a flowchart representing a method 400 of preventing manufacturing defects, such as breakage and/or warpage, of semiconductor wafers during a back-grinding process. Method 400 is described below as performed by system 100, or one that is similar to system 100, e.g., a real-time control system implementing an in-line wafer back-grinding process flow. Thus, the process is described with regard to semiconductor wafer 20, chuck table 110, process control tool 140, back-grinding wheel 150, etc. Other embodiments of method 400 use system 300 or a system similar to system 300.

At a step 410, semiconductor wafer 20 is placed on chuck table 110. Chuck table 110 has one or more pressure sensors 112 disposed within holes 114 in the table, in order to take pressure measurements.

At a step 420, pressure sensors 112 measure an initial pressure value which is the pressure measured when semiconductor wafer 20 rests on chuck table 110, and therefore on sensors 112, but before grinding wheel 150 applies pressure on semiconductor wafer 20. In some embodiments, semiconductor wafer 20 is held in place on chuck table 110 by a vacuum/suction apparatus (not shown). In other embodiments, semiconductor wafer 20 is held in place with a mechanical apparatus (e.g., one or more clamps—also not shown). In other embodiments, a notch prevents the wafer from moving during back-grinding by preventing rotation of the wafer, but places no downward pressure on the wafer. The initial pressure value is a measurement of (i) the pressure exerted by the mass of wafer 20 on sensor 112 and (ii) any downward pressure utilized to hold the wafer in place.

At a step 430, computer process control tool 140 implements a continuous sampling loop of pressure measurements. In some embodiments, pressure sensors 112 transmit an analog signal to control box 130 which then converts the measurement in the analog signal into a digital value. Computer process control tool 140 receives the digital value in "real-time" or near "real-time" and, in some embodiments, analyzes the current reading only. In this manner, the sampling rate effectively becomes the sampling frequency possible by pressure transducers 112. In other embodiments, a specified sample rate different from the sampling rate of sensors 112 is employed by computer process control tool 140 in order to analyze pressure measurements taken only at particular intervals. In exemplary embodiments, the pressure measurement is sampled once every second. In other embodiments, the sample rate is more or less frequent.

In some embodiments, computer process control tool 140 analyzes pressure values averaged over a specific time period, e.g., for the last three seconds. By utilizing an average, erroneous spikes in pressure due to sensor malfunctions or variations are eliminated or minimized with respect to accurate measurements. In other embodiments, sensors 112 located under adjacent areas of wafer 20 are averaged together. Averaging measurements from adjacent sensors 112 mitigates sensor errors when grinding wheel 150 is unable to place a vastly different pressure on one area of the wafer as compared to another area (e.g., grinding wheel 150 is too large to supply much higher pressure to a specific spot on the wafer).

At a step 440, grinding wheel 150 back-grinds back side 24 of semiconductor wafer 20, and thus applies pressure to the wafer. Because a continuous measurement loop is implemented at step 430, computer process control tool 140 receives measurements resulting from the pressure applied on semiconductor wafer 20 by grinding wheel 150.

At a step 450, computer process control tool 140 analyzes the pressure applied by grinding wheel 150 to determine if the measured pressure exceeds a specified threshold value. Again, the measured pressure is determined on a continuous basis, whether the measurement is real-time, sampled, and/or averaged. If the measured pressure exceeds the specified threshold value, the process continues to a step 455, where the pressure applied by grinding wheel 150 is decreased, e.g., by slightly raising grinding wheel 150.

If the measured pressure does not exceed (i.e., is at or below) the specified threshold value, the process continues to a step 460, where computer process control tool 140 determines if the appropriate thickness of wafer 20 has been reached. In some embodiments, computer process control tool 140 makes the determination based on grinding wheel 150 applying a within-limit pressure for a specified time period. For example, if the time period has not elapsed, the process returns to step 440, where grinding wheel 150 continues to apply pressure to semiconductor wafer 20. If the time period has elapsed, then the desired thickness is presumed to be reached, and the process ends at a step 470. Other embodiments employ further arrangements for determining the desired wafer thickness, e.g., by monitoring the current used to drive grinding wheel 150, or by monitoring the capacitance, and hence the distance, between the wafer and a capacitive plate above the wafer.

Figure 5:
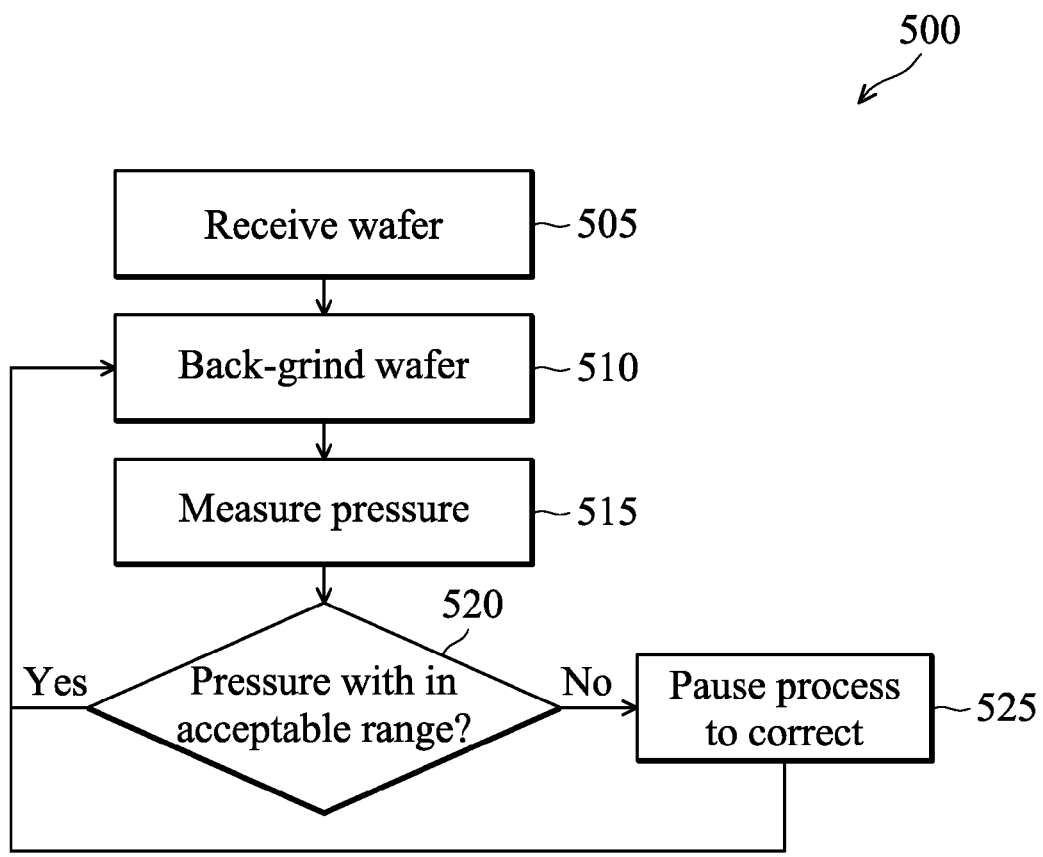
FIG. 5 is a flowchart representing a method of improving uniformity in semiconductor wafer thickness during a back-grinding process in accordance with one or more embodiments.

FIG. 5 is a flowchart depicting a method 500 of improving uniformity in semiconductor wafer thickness in accordance with one or more embodiments. Method 500 is implemented during a back-grinding process utilizing a chuck table, for example, chuck table 110 of system 100 disclosed with respect to FIGS. 1 and 2.

Method 500 starts with a step 505, during which wafer 200 is received on chuck table 110. At a step 510, grinding wheel 150 applies pressure to wafer 200 during a back-grinding process, as exemplarily described above. At a step 515, one or more pressure transducers 112 embedded in chuck table 110 measure the pressure applied to wafer 20 by grinding wheel 150.

The measurements of pressure transducers 112 are converted to a series of values that are read by a statistical process control (SPC) tool, such as computer process control tool 140, at a step 520. In some embodiments, if any of the process parameters fall outside a specified range (e.g., if a process parameter is higher than an upper limit or lower than a lower limit of the range), the process is stopped or paused for adjustment. For example, a lower limit of 50 newtons and an upper limit of 60 newtons are enforced in an exemplary embodiment. Readings of less than 50 newtons or more than 60 newtons cause SPC tool 140 to pause the process for adjusting the pressure applied by grinding wheel 150 on wafer 20. Otherwise, the back-grinding continues until the wafer reaches the desired thickness.

Although the description above mostly concerns the back-grinding process, one or more embodiments in the above description are also applicable to the polishing process.

Figure 6:
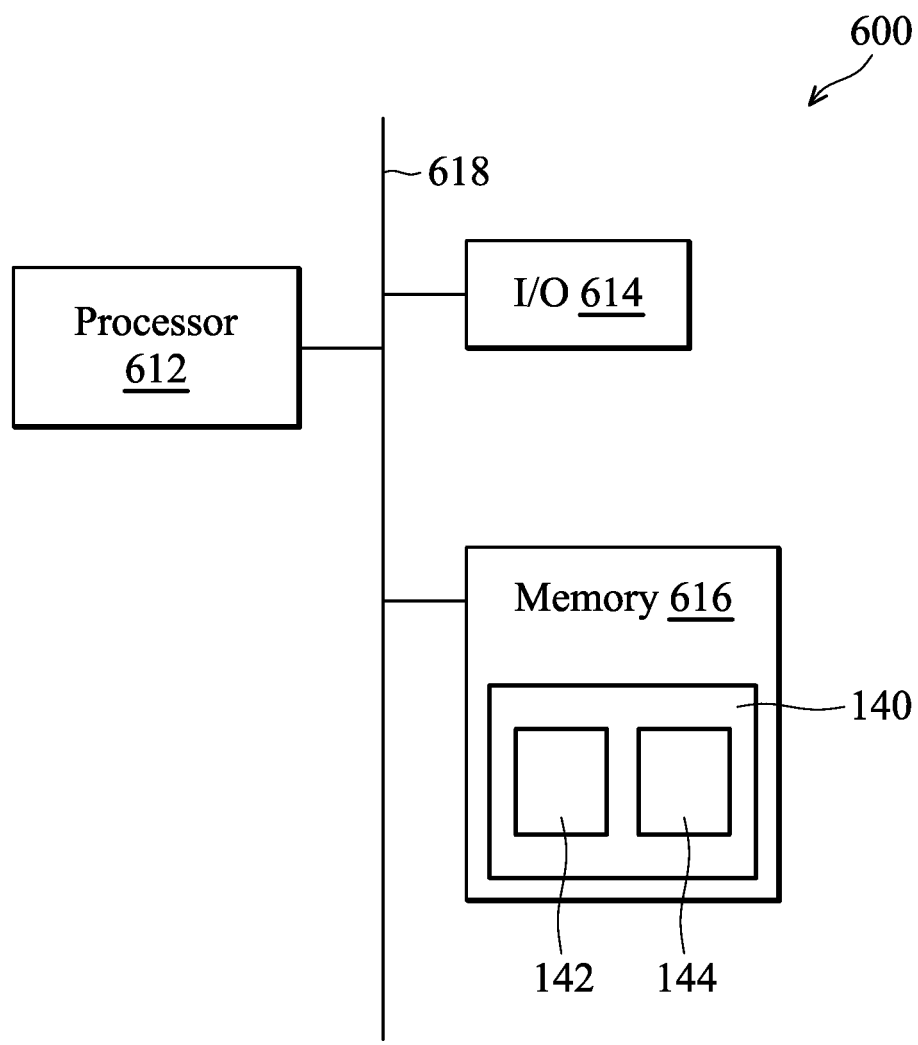
FIG. 6 is a high-level functional block diagram of a computing system in connection with which a computer process control tool in accordance with one or more embodiments is executed.

FIG. 6 is a high-level diagram of a computing device 600 configured to execute, among other things, process control tool 140. Computing device 600 includes a bus 618 that communicatively couples processor 612, a memory 616, and input/output (I/O) component 614. Memory 616 is coupled to bus 610 for storing data and information, e.g., instructions, to be executed by computing device 600. Memory 616 also may be used for storing temporary variables or other intermediate information during execution of instructions to be executed by computing device 600. Memory 616 may also comprise a read only memory (ROM) or other static storage device coupled to bus 618 for storing static information and instructions for computing device 600. Memory may comprise static and/or dynamic devices for storage, e.g., optical, magnetic, and/or electronic media and/or a combination thereof.

I/O component 614 comprises a mechanism for connecting to a network. In at least some embodiments, I/O component 614 may comprise a wired and/or wireless connection mechanism. In at least some embodiments, computing device 600 may communicate with another computing device, e.g., a computer system, via I/O component 614. I/O component 614 comprises a serial and/or a parallel communication mechanism. Non-limiting, exemplary embodiments of I/O component 614 include at least a wireless Universal Serial Bus (USB) interface, an Ethernet interface, a WiFi or WiMAX™ or BLUETOOTH interface, a cellular interface, etc.

Shown as a part of memory 616 (also referred to as a computer-readable medium) is process control tool 140. A table of received parameters 142 is part of process control tool 140, as is a table of acceptable ranges 144 (e.g., a range of acceptable pressure on a wafer being back-ground). Table 144 contains the values against which received parameters 142 (e.g., pressure readings from sensors 112) are compared, in order for SPC 140 to determine if the monitored back-grinding process continues or is paused. In some embodiments, table 144 contains pressure values for a back-grinding process in an in-line process flow as exemplarily disclosed with respect to FIG. 1. In other embodiments, table 144 contains a range of pressure values at which back-grinding occurs with a multiple-concurrent wafer process flow as exemplarily disclosed with respect to FIG. 3. In some embodiments, table 144 includes an upper limit that, if met or exceeded, stops or pauses the back-grinding process to prevent manufacturing defects, such as wafer breakage or warpage, as outlined in the method exemplarily represented by FIG. 4. In other embodiments, table 144 includes upper and lower limits to provide a range that leads to improved TTV as outlined in the exemplary method of FIG. 5. In still other embodiments, table 144 includes parameters that carry out both methods, or other methods contemplated within the spirit and scope of the present disclosure.

One aspect of this description relates to a method of reducing manufacturing defects of semiconductor wafers during a back-grinding process. The method includes receiving a semiconductor wafer on a chuck table, wherein said chuck table has a surface upon which a front side of the wafer is placed, and wherein said chuck table has one or more holes in surface and one or more sensors placed in said one or more holes. The method further includes grinding at least a portion of a back side of the semiconductor wafer. The method further includes monitoring a parameter, while grinding, measured by the one or more sensors and adjusting the grinding based at least on the monitored parameter.

Another aspect of this description relates to a method of improving uniformity in semiconductor wafer thickness during a back-grinding process utilizing a chuck table that has an upper surface, one or more holes bored perpendicularly into the surface, and one or more pressure transducers placed within the one or more holes. The method includes receiving a wafer on the upper surface of the chuck table to be in direct contact with the pressure transducers and applying pressure to the wafer by a grinding wheel during a back-grinding process. The method further includes measuring the pressure applied to the wafer by the grinding wheel utilizing the pressure transducers and converting the measurements of said pressure transducers to a series of values readable by a statistical process control (SPC) tool. If the values are outside a specified range, pausing the back-grinding process, but if the values are within the specified range, continuing the back-grinding process until a desired thickness of the wafer is achieved.

Still another aspect of this description relates to a method of polishing semiconductor wafers. The method includes receiving a semiconductor wafer on a chuck table, wherein said chuck table has a surface upon which a front side of the wafer is placed, and wherein said chuck table has one or more holes in surface and one or more sensors placed in said one or more holes. The method further includes polishing at least a portion of a back side of the semiconductor wafer. The method further includes monitoring a parameter, while polishing, measured by the one or more sensors and adjusting the polishing based at least on the monitored parameter.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of reducing manufacturing defects of semiconductor wafers during a back-grinding process, the method comprising:
   receiving a semiconductor wafer on a chuck table, wherein said chuck table has a surface upon which a front side of the wafer is placed, and wherein said chuck table has one or more holes in the surface and one or more sensors placed respectively in said one or more holes adjacent to the front side of the wafer;
   grinding at least a portion of a back side of the semiconductor wafer;
   while grinding, monitoring a parameter measured by the one or more sensors; and
   adjusting the grinding based at least on the monitored parameter.

2. The method of claim 1, wherein the one or more sensors are one or more pressure transducers.

3. The method of claim 2, further comprising:
   determining an initial pressure exerted by the wafer on the pressure transducers before said grinding; and
   factoring out the initial pressure from pressure readings outputted by the pressure transducers.

4. The method of claim 2, wherein said monitoring includes
   monitoring pressure readings outputted by the pressure transducers in real time at a sampling rate of the pressure transducers.

5. The method of claim 2, wherein said monitoring includes
   monitoring pressure readings outputted by the pressure transducers periodically at a sampling rate different from that of the pressure transducers.

6. The method of claim 2, wherein said monitoring includes
   averaging pressure readings outputted by the pressure transducers over a specific time period and outputting the averaged pressure reading as the monitored parameter.

7. The method of claim 2, wherein said adjusting includes
   in response to a determination that the monitored parameter exceeds a pressure threshold value, reducing a pressure applied on the wafer by a grinding wheel used for grinding the back side of said wafer.

8. The method of claim 1, wherein the monitoring and the adjusting are carried out by a computer-implemented process control tool.

9. The method of claim 1, wherein the method is part of one of an in-line back-grinding process or a multiple-concurrent-wafer back-grinding process.

10. The method of claim 1, further comprising taping the front side of the wafer, wherein the one or more sensors are in contact with the tape on the front side of the wafer.

11. A method of improving uniformity in semiconductor wafer thickness during a back-grinding process utilizing a chuck table that has an upper surface, a plurality of holes bored perpendicularly into the surface, and a plurality of pressure transducers, the method comprising:
receiving a wafer on the upper surface of the chuck table to be in direct contact with the pressure transducers;
applying pressure to the wafer by a grinding wheel during the back-grinding process;
measuring the pressure applied to the wafer by the grinding wheel utilizing the pressure transducers, wherein each pressure transducer of the plurality of pressure transduces is located in a corresponding hole of the plurality of holes;
converting measurements of said pressure transducers to a series of values readable by a statistical process control (SPC) tool; and
if the values are outside a specified range, pausing the back-grinding process, but if the values are within the specified range, continuing the back-grinding process until a desired thickness of the wafer is achieved.

12. The method of claim 11, further comprising
determining a thickness of the wafer based on time and pressure measurements; and
stopping the back-grinding process when the determined thickness equals the desired thickness.

13. The method of claim 11, further comprising applying a tape over a surface of the wafer adjacent the pressure transducers.

14. The method of claim 11, wherein applying the pressure during the back grinding process comprises rotating the grinding wheel and the chuck table.

15. The method of claim 14, further comprising rotating the grinding wheel in a same direction as the chuck table.

16. The method of claim 14, further comprising rotating the grinding wheel in an opposite direction from the chuck table.

17. A method of polishing semiconductor wafers, the method comprising:
receiving a semiconductor wafer on a chuck table, wherein said chuck table has a surface upon which a front side of the wafer is placed, and wherein said chuck table has one or more holes in the surface and one or more sensors placed respectively in said one or more holes;
polishing at least a portion of a back side of the semiconductor wafer using a polishing wheel;
while polishing, monitoring a parameter measured by the at least two sensors;
determining a sensor error based on a measurement of two adjacent sensors; and
adjusting the polishing based at least on the monitored parameter.

18. The method of claim 17, wherein adjusting the polishing comprises raising the polishing wheel in response to the monitored parameter exceeding a threshold value.

19. The method of claim 17, wherein monitoring the parameter comprises measuring a pressure using one or more pressure transducers.

20. The method of claim 17, further comprising
calculating a duration for the polishing based on the monitored parameter; and
stopping the polishing when a polishing time reaches the calculated duration.

\* \* \* \* \*